United States Patent
Gallo et al.

(10) Patent No.: US 11,251,754 B2
(45) Date of Patent: Feb. 15, 2022

(54) PWM CLIPPING DETECTOR CIRCUIT, CORRESPONDING ELECTRONIC SYSTEM AND METHOD

(71) Applicant: STMicroelectronics S.r.l., Agrate Brianza (IT)

(72) Inventors: Noemi Gallo, Bareggio (IT); Edoardo Botti, Vigevano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 29 days.

(21) Appl. No.: 16/794,760

(22) Filed: Feb. 19, 2020

(65) Prior Publication Data

US 2020/0280287 A1    Sep. 3, 2020

(30) Foreign Application Priority Data

Feb. 28, 2019   (IT) .................... 102019000002953

(51) Int. Cl.

| | |
|---|---|
| *H03F 1/26* | (2006.01) |
| *H03F 3/217* | (2006.01) |
| *H03F 3/181* | (2006.01) |
| *H03G 11/00* | (2006.01) |
| *H03F 3/38* | (2006.01) |

(52) U.S. Cl.
CPC .............. *H03F 1/26* (2013.01); *H03F 3/181* (2013.01); *H03F 3/217* (2013.01); *H03G 11/00* (2013.01); *H03F 2200/03* (2013.01); *H03F 2200/66* (2013.01)

(58) Field of Classification Search
CPC . H03F 1/26; H03F 3/181; H03F 3/217; H03F 2200/03; H03F 2200/66; H03F 1/32; H03F 2200/351; H03F 3/2173; H03G 11/00; H03G 3/30; H03K 7/08; H03K 5/1252; H03K 5/08; H03K 5/05
USPC ........................................ 330/10, 251, 207 A
See application file for complete search history.

(56) References Cited

U.S. PATENT DOCUMENTS

| | | | | |
|---|---|---|---|---|
| 4,724,396 | A * | 2/1988 | Taylor, Jr | H03F 3/2171 |
| | | | | 330/10 |
| 10,110,182 | B2 * | 10/2018 | Chadha | H03F 3/2173 |
| 2006/0008095 | A1 | 1/2006 | Tsuji | |
| 2007/0183490 | A1 | 8/2007 | Andersen et al. | |
| 2014/0125411 | A1 | 5/2014 | Holzmann et al. | |

* cited by examiner

*Primary Examiner* — Hieu P Nguyen
(74) *Attorney, Agent, or Firm* — Slater Matsil, LLP

(57) ABSTRACT

A clipping detector circuit includes a timer circuit and a counter circuit. The timer circuit is configured to monitor a time period elapsing since a last occurrence of an edge in a PWM signal, assert a first signal when the time period elapses, and de-assert the first signal and reset the time period as a result of an edge occurring in the PWM signal. The counter circuit is configured to determine a number of pulses in the PWM signal since the last de-assertion of the first signal, and assert a second signal when the number of pulses in the PWM signal since the last de-assertion of the first signal reaches m pulses. The clipping detector circuit is configured to generate a clipping detection signal indicative of whether the pulse-width modulated signal is clipped or not as a function of the first signal and the second signal.

21 Claims, 5 Drawing Sheets

PWM CLIPPING DETECTOR CIRCUIT, CORRESPONDING ELECTRONIC SYSTEM AND METHOD

CROSS-REFERENCE TO RELATED APPLICATIONS

This application claims priority to Italian Patent Application No. 102019000002953, filed on Feb. 28, 2019, which application is hereby incorporated herein by reference.

TECHNICAL FIELD

The present disclosure relates generally to an electronic system and method, and, in particular embodiments, to a pulse width modulation (PWM) clipping detector circuit, corresponding electronic system and method.

BACKGROUND

Clipping is a form of waveform distortion that limits a signal once it exceeds a certain threshold. Clipping may occur, for instance, when an amplifier is overdriven and attempts to deliver an output voltage or current beyond its maximum capability, i.e., when the amplifier is saturated.

In the case of PWM signals, clipping (also referred to as "saturation" in the present description) may result in a duty cycle which is close or equal to 0% or 100%.

Particularly in the case of audio systems comprising switching PWM modulators, the behavior of the audio system may be affected as a result of the PWM signal being saturated or almost saturated, i.e., when clipping may occur.

Therefore, detecting clipping phenomena of PWM signals may be relevant, insofar as detecting clipping may provide a way for recognizing saturation of the PWM signal and consequently triggering feedback devices and/or corrective techniques for limiting distortion effects on the output signal of the (audio) system.

Known solutions for detecting clipping of a PWM signal are based on counting "missing" pulses in the PWM signal generated by a PWM modulator circuit, as exemplified in FIGS. 1 and 2.

FIG. 1 is a circuit diagram exemplary of a PWM modulator circuit 10 and a clipping detection circuit 12 coupled thereto. The PWM modulator circuit 10 is configured to generate a PWM signal $PWM_{out}$, and the clipping detection circuit 12 is configured to detect clipping (i.e., saturation) of the signal $PWM_{out}$.

The PWM modulator circuit 10 comprises:

a signal integrator comprising an operational amplifier 100 and a capacitor 102 coupled between the output node of the operational amplifier 100 and a first input node of the operational amplifier 100, the operational amplifier 100 configured for receiving an input square-wave (current) signal Isq at the first input node and generating thereby an output periodic carrier signal $V_{tri}$, e.g., a triangular or saw-tooth periodic carrier signal, and a comparator circuit 104 receiving at a first input node the periodic carrier signal $V_{tri}$ and at a second input node a modulation signal $V_{mod}$, thereby generating an output pulse-width modulated signal $PWM_{out}$ having a duty cycle which is a function of the amplitude of the modulation signal $V_{mod}$.

As long as the modulation signal $V_{mod}$ is comprised between an upper threshold $V_{tri,H}$ and a lower threshold $V_{tri,L}$ of the periodic carrier signal $V_{tri}$, the signal $PWM_{out}$ is not saturated (or clipped) and comprises a pulse, i.e., a pair of edges (one rising edge and one falling edge), at each period of the periodic carrier signal $V_{tri}$.

Conversely, as a result of the modulation signal $V_{mod}$ being not comprised between the upper threshold $V_{tri,H}$ and the lower threshold $V_{tri,L}$ (i.e., $V_{mod}$ being higher than $V_{tri,H}$ or lower than $V_{tri,L}$), the output node of the comparator circuit 104 does not commute and the signal $PWM_{out}$ is saturated, i.e., the signal $PWM_{out}$ does not comprise edges and stays at a low logic level (as exemplified in FIG. 2, when $V_{mod} > V_{tri,H}$) or at a high logic level.

Therefore, saturation (clipping) of signal $PWM_{out}$ can be detected by sensing the signal $PWM_{out}$ and detecting "missing" pulses therein by using a clipping detection circuit 12, i.e., detecting the absence of a pulse in the signal $PWM_{out}$ during at least one period of the periodic carrier signal $V_{tri}$.

In known solutions as exemplified in FIG. 1, a clipping detection circuit 12 comprises an up-counter 120 (implemented, for instance, with one or more flip-flops) configured to receive the signal $PWM_{out}$ and a clock signal ClkPkTri.

The clock signal ClkPkTri is a clock signal synchronized with the periodic carrier signal $V_{tri}$. For instance, clock signal ClkPkTri may be synchronized with peaks and valleys of the periodic carrier signal $V_{tri}$, e.g., having a falling edge when the periodic carrier signal $V_{tri}$ reaches the upper threshold $V_{tri,H}$ and a rising edge when the periodic carrier signal $V_{tri}$ reaches the lower threshold $V_{tri,L}$, as exemplified in FIG. 2.

The signal $PWM_{out}$ is received at an (asynchronous) reset input R of the up-counter 120, so that the up-counter 120 increases (e.g., by one unit) an internal count number at each period of the clock signal ClkPkTri (e.g., at each rising edge or falling edge of the clock signal ClkPkTri), with the internal count number being (asynchronously) reset to zero at each occurrence of a pulse in the signal $PWM_{out}$.

The clipping detection circuit 12 therefore counts the number of consecutive missing pulses in the received signal $PWM_{out}$, being a pulse expected at each period of the clock signal ClkPkTri if the signal $PWM_{out}$ is not saturated.

As a result of the count of consecutive missing pulses reaching a certain value n (e.g., n=3), an output signal ClipDet of the clipping detection circuit 12 is asserted (e.g., set to high, see instant $t_1$ in FIG. 2), thereby indicating saturation of the signal $PWM_{out}$.

In known solutions as exemplified in FIG. 1, the clipping detection circuit 12 also comprises an internal logic reset circuit (not visible in the Figures annexed herein) configured to de-assert (e.g., set to low) the output signal ClipDet at the first occurrence of a pulse in the signal $PWM_{out}$ after assertion of the saturation condition (see, for instance, instant $t_2$ in FIG. 2), i.e., when the internal count number is reset to zero.

SUMMARY

Despite the extensive activity in the area, further improved solutions are desirable.

Some embodiments relate to circuits and methods for detecting clipping of signals.

One or more embodiments may be applied to detecting clipping of pulse-width modulated (PWM) signals. For instance, one or more embodiments may be applied to detecting clipping of PWM signals in audio systems.

Some embodiments increase robustness of clipping detection circuits and methods for PWM signals against possible spurious commutations due to noise.

Some embodiments reduce instability of the output signal in clipping detection circuits for PWM signals, particularly in the case of PWM signals at relatively high frequency, e.g., higher than 1 MHz.

The inventors have observed that the known solutions as exemplified in FIG. 1 are not suitable for use with PWM signals at relatively high frequency, e.g., at frequencies higher than 1 MHz, since they may not be stable.

In particular, the inventors have observed that at a higher frequency the up-counter 120 in the clipping detection circuit 12 increases the internal count number at a faster rate, so that at low frequencies detection of clipping may take place unexpectedly soon also when the signal $PWM_{out}$ is not clipped, unless the value n is chosen high. Considering low-frequency signals such as 1 kHz or lower, the clipping detection suffers from a longer time interval during which the PWM amplifier loses and acquires pulses (corresponding to an instability region of class-D amplifiers), caused by an intrinsic limitation of the smallest/biggest duty-cycle realized by the switching stage. This phenomenon worsens as a result of the frequency of the clock signal ClockPkTri increasing, e.g., increasing from 300 kHz to 2 MHz, causing the output signal ClipDet to switch ON/OFF many times.

Also, known solutions may suffer from the presence of noise in the modulation signal $V_{mod}$ especially when the duty cycle of the signal $PWM_{out}$ is close to 0% or 100%, i.e., when the modulation signal $V_{mod}$ is close to one of the upper threshold $V_{tri,H}$ and the lower threshold $V_{tri,L}$ of the periodic carrier signal $V_{tri}$. In these conditions, the signal $PWM_{out}$ may be rather unstable and have less regular pulses, so that also the output signal ClipDet may be affected by instability, e.g., comprising spurious commutations, with this issue being even more relevant in case of high switching frequencies such as, e.g., 2 MHz.

Some embodiments relate to a circuit for detecting clipping of signals.

Some embodiments relate to a corresponding electronic system.

Some embodiments relate to a corresponding method.

As mentioned above, various embodiments of the present disclosure relate to a clipping detector circuit.

In various embodiments, the clipping detector circuit is configured to detect clipping of a pulse-width modulated signal and comprises:
  a timer circuit configured to monitor edges of the pulse-width modulated signal and to:
    monitor a time period elapsing since a last occurrence of an edge in the pulse-width modulated signal,
    assert a first signal when the time period elapses, and
    de-assert the first signal and reset the time period as a result of an edge occurring in the pulse-width modulated signal; and
  a counter circuit configured to:
    monitor the pulse-width modulated signal and the first signal,
    determine the number of pulses in the pulse-width modulated signal since the last de-assertion of the first signal, and
    assert a second signal when the number of pulses in the pulse-width modulated signal since the last de-assertion of the first signal reaches a certain number m of pulses.

In various embodiments, the clipping detector circuit is configured for generating at output a clipping detection signal indicative of whether the pulse-width modulated signal is clipped or not as a function of the first signal and the second signal.

In various embodiments, the timer circuit in the clipping detector circuit is implemented with a further counter circuit configured to receive a clock signal and to assert the first signal as a result of a certain number n of periods of the clock signal elapsing since a last occurrence of an edge in the pulse-width modulated signal.

In various embodiments, the clock signal has the same period of the pulse-width modulated signal.

In various embodiments, the further counter circuit in the clipping detector circuit is configured to:
  receive the pulse-width modulated signal at a respective reset input and the clock signal at a respective clock input,
  increase a respective internal count number at each cycle of the clock signal and reset to zero the respective internal count number at each occurrence of an edge in the pulse-width modulated signal, and
  assert the first signal as a result of the respective internal count number reaching a certain number n.

In various embodiments, the counter circuit in the clipping detector circuit is configured to:
  receive the first signal at a respective reset input and the pulse-width modulated signal at a respective clock input,
  increase a respective internal count number at each occurrence of a pulse in the pulse-width modulated signal and reset to zero the respective internal count number at each assertion of the first signal, and
  assert the second signal as a result of the respective internal count number reaching a certain number m.

In various embodiments, the clipping detector circuit comprises an OR logic gate configured to generate the output clipping detection signal by performing OR processing of the first signal and a complemented replica of the second signal.

Various embodiments relate to an electronic system comprising:
  a switching PWM modulator circuit configured to generate a pulse-width modulated signal by comparing a modulation signal to a periodic carrier signal,
  a clipping detector circuit according to one or more embodiments coupled to the switching PWM modulator circuit and configured to generate at output a clipping detection signal indicative of whether the pulse-width modulated signal is clipped or not, and
  a control unit configured to receive the clipping detection signal from the clipping detector circuit and to act on the switching PWM modulator circuit to counter clipping of the pulse-width modulated signal as a result of the clipping detection signal being indicative of the pulse-width modulated signal being clipped.

Various embodiments relate to a method of detecting clipping of a pulse-width modulated signal by using a circuit according to one or more embodiments or an electronic system according to one or more embodiments, the method comprising:
  monitoring edges of the pulse-width modulated signal,
  monitoring a time period elapsing since a last occurrence of an edge in the pulse-width modulated signal,
  asserting a first signal when the time period elapses,
  de-asserting the first signal and resetting the time period as a result of an edge occurring in the pulse-width modulated signal,
  determining the number of pulses in the pulse-width modulated signal since the last de-assertion of the first signal, asserting a second signal when the number of pulses in the pulse-width modulated signal since the last de-assertion of the first signal reaches a certain number m of pulses, and generating a clipping detection signal indicative of whether the pulse-width modulated signal is clipped or not as a function of the first signal and the second signal.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

The references used herein are provided merely for convenience and hence do not define the extent of protection or the scope of the embodiments.

Figure 1:
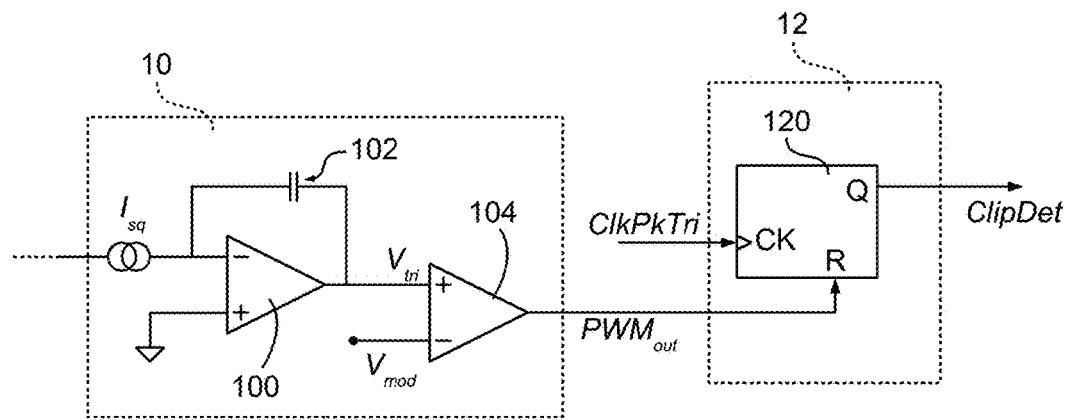
FIGS. 1 and 2 have been described in the foregoing.
Figure 2:
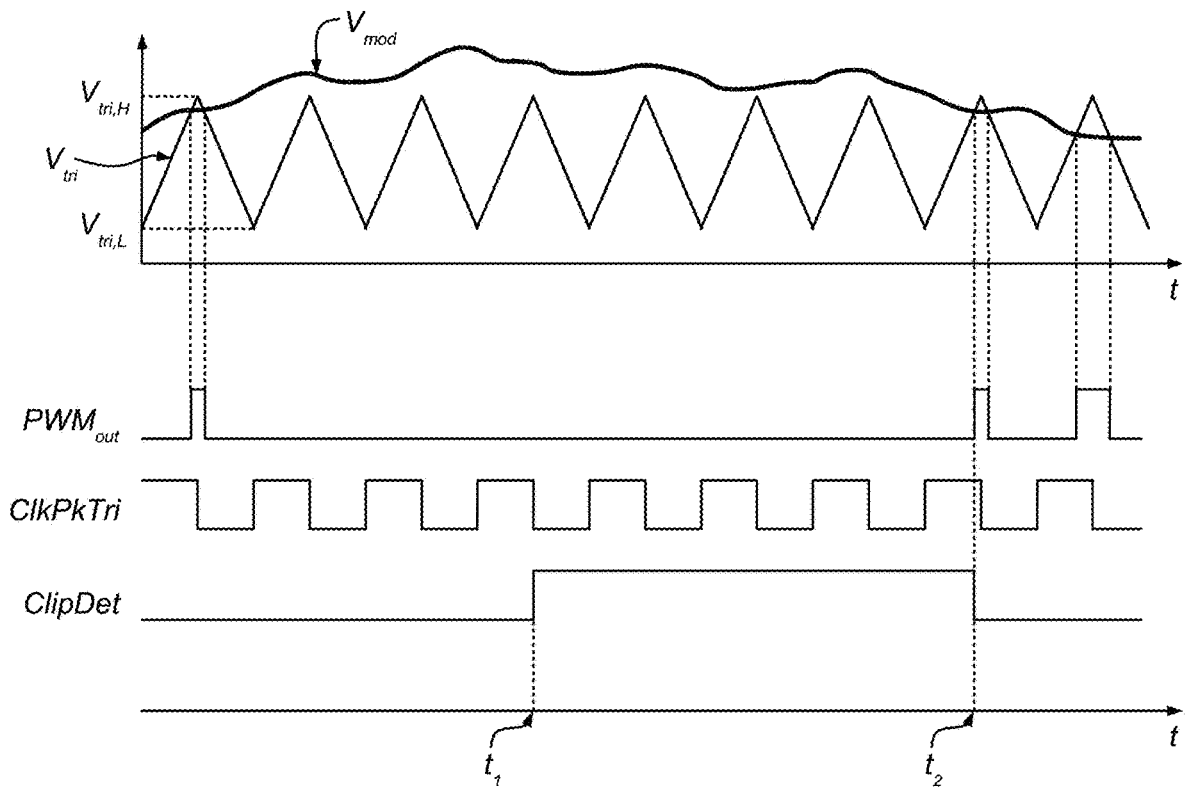
Figure 3:
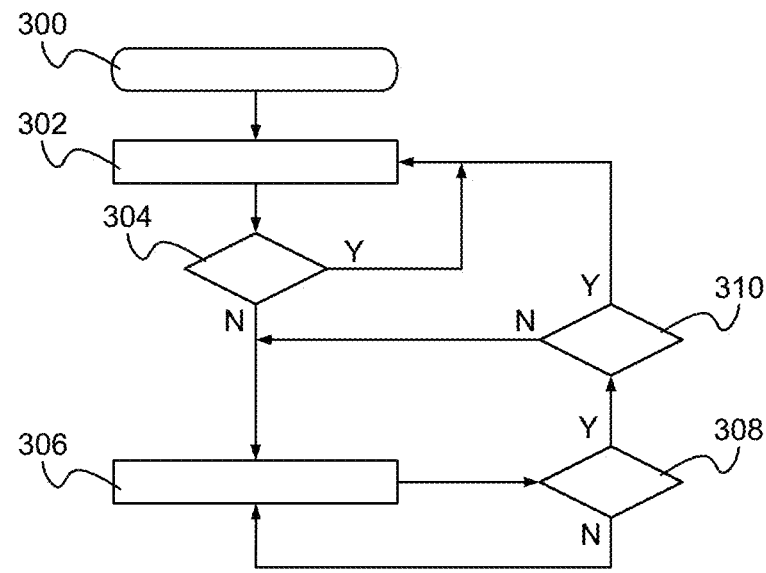
FIG. 3 is a flow chart exemplary of one or more embodiments.

FIG. 3 is a flow chart exemplary of steps of a method of detecting clipping of a PWM signal according to one or more embodiments.

The method comprises:

monitoring a pulse-width modulated signal $PWM_{out}$ to determine a time period elapsing since a last occurrence of an edge in the pulse-width modulated signal $PWM_{out}$, asserting a first signal ClipDet when the time period reaches a certain threshold, de-asserting the first signal ClipDet and resetting the time period as a result of an edge occurring in the pulse-width modulated signal $PWM_{out}$, determining a number of pulses in the pulse-width modulated signal $PWM_{out}$ since the last de-assertion of the first signal ClipDet, asserting a second signal ClipOut when the number of pulses in the pulse-width modulated signal $PWM_{out}$ since the last de-assertion of the first signal ClipDet reaches a certain number m of pulses, and generating a clipping detection signal ClipDet' indicative of whether the pulse-width modulated signal $PWM_{out}$ is clipped or not as a function of the first signal ClipDet and the second signal ClipOut.

In particular, the method may comprise:

receiving the pulse-width modulated signal $PWM_{out}$, for instance generated by comparing a modulation signal $V_{mod}$ with a periodic carrier signal $V_{tri}$ (e.g., a triangular or saw-tooth periodic signal) in a switching PWM modulator circuit 10, receiving a clock signal ClkPkTri having the same period of the pulse-width modulated signal $PWM_{out}$, for instance being synchronized with the periodic carrier signal $V_{tri}$ (e.g., having falling and rising edges corresponding to peaks and valleys of the periodic carrier signal $V_{tri}$), and generating thereby an output clipping detection signal ClipDet' indicative of whether the signal $PWM_{out}$ is clipped or not.

It will be understood that receiving the signals $PWM_{out}$ and ClkPkTri and generating the signal ClipDet' are actions which may be performed continuously according to the method, with the value of the output signal ClipDet' which may change at any point in time as a function of the signal $PWM_{out}$.

In particular, after starting at a step 300, the method may comprise at a step 302 setting to a first (default) value the clipping detection signal ClipDet', the first value (e.g., ClipDet'=0, de-asserted) being indicative of the signal $PWM_{out}$ not being clipped and the switching PWM modulator operating in the so-called "linear region".

After setting the clipping detection signal ClipDet' to the first (default) value, the method may comprise periodically checking, for instance at each period of the clock signal ClkPkTri (e.g., at each rising or falling edge thereof), whether the signal $PWM_{out}$ has had at least one voltage transition (e.g., one rising edge or one falling edge, also referred to as voltage commutation in the present disclosure) over a certain time period $T_{MAX}$, as exemplified by block 304 in FIG. 3. For instance, the time period $T_{MAX}$ may correspond to a certain number n (e.g., n=3) of the past (latest) periods of the clock signal ClkPkTri preceding the checking act 304.

In case the signal $PWM_{out}$ has had at least one voltage transition over a time period $T_{MAX}$ preceding the checking act 304 (e.g., over n of the past periods of the clock signal ClkPkTri), corresponding to a positive outcome Y of block 304, the value of the clipping detection signal ClipDet' may not be changed (i.e., it may be left with the first value indicative of the signal $PWM_{out}$ not being clipped) and the checking act 304 may be repeated on the signal $PWM_{out}$, e.g., at the next period of the clock signal ClkPkTri.

Therefore, if the signal $PWM_{out}$ has at least one voltage transition every time period $T_{MAX}$ (e.g., every n clock periods), it may be detected as not clipped (saturated), and the method may cyclically go through steps 302 and 304, periodically performing the checking act 304 (e.g., at each clock cycle) and leaving unchanged the value of the clipping detection signal ClipDet' as long as the outcome of the checking act 304 is positive, i.e., as long as the signal PWM$_{out}$ is not clipped.

In case the checking act 304 detects that the signal PWM$_{out}$ has not had at least one voltage transition over a time period T$_{MAX}$ preceding the checking act 304 (e.g., over n of the past latest periods of the clock signal ClkPkTri), corresponding to a negative outcome N of block 304, the value of the clipping detection signal ClipDet' may be changed (e.g., it may be switched to a second value indicative of the signal PWM$_{out}$ being clipped and the switching PWM modulator operating in the so-called "clipping region") in an act exemplified by block 306.

After setting the clipping detection signal ClipDet' to the second value, the method may comprise again periodically checking, e.g., at each period of the clock signal ClkPkTri, whether the signal PWM$_{out}$ has had at least one voltage transition over a certain time period T$_{MAX}$ (e.g., again a certain number n of the past latest periods of the clock signal ClkPkTri), as exemplified by block 308 in FIG. 3.

In case the signal PWM$_{out}$ has not had at least one voltage transition over the time period T$_{MAX}$ (e.g., over n of the past periods of the clock signal ClkPkTri), corresponding to a negative outcome N of block 308, the value of the clipping detection signal ClipDet' may not be changed (i.e., it is left with the second value indicative of the signal PWM$_{out}$ being clipped) and the checking act 308 may be repeated on the signal PWM$_{out}$, e.g., at the next period of the clock signal ClkPkTri.

Therefore, if the signal PWM$_{out}$ remains clipped (saturated) with no voltage transitions over a time period T$_{MAX}$ (e.g., n of the past periods of the clock signal ClkPkTri), the method may cyclically go through steps 306 and 308, periodically performing the checking act 308 (e.g., at each clock cycle) and leaving unchanged the value of the clipping detection signal ClipDet' as long as the outcome of the checking act 308 is negative, i.e., as long as the signal PWM$_{out}$ is clipped.

In case the checking act 308 detects that the signal PWM$_{out}$ has had at least one voltage transition over a time period T$_{MAX}$ (e.g., n of the past periods of the clock signal ClkPkTri), corresponding to a positive outcome Y of block 308, a further checking act 310 may be performed.

The further checking act 310 comprises checking whether the signal PWM$_{out}$ has had at least a certain number m of pulses since the last occurrence of a negative outcome of the checking act 308, i.e., since the last time the signal PWM$_{out}$ was found to be clipped (saturated).

In case the signal PWM$_{out}$ has not had a certain number m of pulses since the last occurrence of a negative outcome of the checking act 308 (negative outcome, N, of block 310), the value of the clipping detection signal ClipDet' may not be changed (i.e., it may be left with the second value indicative of the signal PWM$_{out}$ being clipped) and the checking act 308 may be repeated on the signal PWM$_{out}$, e.g., at the next period of the clock signal ClkPkTri.

Therefore, even if the signal PWM$_{out}$ may have (temporarily) exited from the saturation/clipping condition (as indicated by the positive outcome of the checking act 308), the clipping detection signal ClipDet' may be de-asserted (only) as a result of the signal PWM$_{out}$ comprising at least a certain number m of pulses since the last voltage transition over a time period T$_{MAX}$ detected in the signal PWM$_{out}$.

In case the checking act 310 detects that the signal PWM$_{out}$ has had a certain number m of pulses since the last occurrence of a negative outcome of the checking act 308 (positive outcome, Y, of block 310), the value of the clipping detection signal ClipDet' may be changed (e.g., it may be switched to the first value indicative of the signal PWM$_{out}$ not being clipped) and the method may resume operation from step 302.

Therefore, advantageously with respect to known solutions, an embodiment method, e.g., as exemplified in FIG. 3, improves stability of the clipping detection signal ClipDet' in particular when the signal PWM$_{out}$ exits from the clipping condition, and/or in cases where the duty-cycle of signal PWM$_{out}$ is close to 0% or 100% (i.e., when signal PWM$_{out}$ is almost saturated and spurious commutations of the clipping detection signal ClipDet' may happen).

Figure 4:
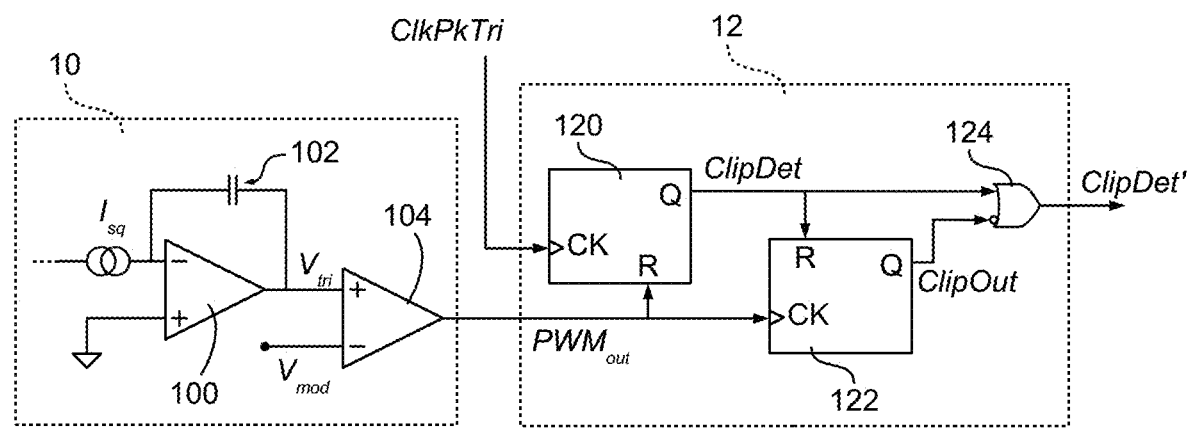
FIG. 4 is a circuit diagram exemplary of one or more embodiments.

FIG. 4 is a circuit diagram exemplary of one or more embodiments suitable for implementing a method as exemplified with reference to FIG. 3.

In FIG. 4, the reference number 12 indicates a clipping detection circuit 12 configured to co-operate with a switching PWM modulator circuit 10.

As previously discussed, the switching PWM modulator circuit 10 is configured to generate a pulse-width modulated signal PWM$_{out}$ by comparing a modulation signal V$_{mod}$ with a periodic carrier signal V$_{tri}$ (e.g., a triangular or saw-tooth signal).

The clipping detection circuit 12 comprises a first timer circuit 120 configured for monitoring whether the signal PWM$_{out}$ has had at least one voltage transition over a certain time period T$_{MAX}$.

For instance, the timer circuit 120 may be configured to sense (monitor) edges (rising and/or falling) of the signal PWM$_{out}$ and to assert (e.g., set to high) a respective output signal ClipDet as a result of a certain time period T$_{MAX}$ elapsing since the last occurrence of an edge in the signal PWM$_{out}$, thereby indicating saturation of the signal PWM$_{out}$.

Additionally, the timer circuit 120 is configured to de-assert the respective output signal ClipDet and to reset the internal timer as a result of an edge occurring in the signal PWM$_{out}$.

Preferably, the timer circuit 120 may be implemented with a first up-counter 120 configured to receive the signal PWM$_{out}$ and a clock signal ClkPkTri.

Thus, in the presently considered embodiment, the signal PWM$_{out}$ is received at a reset input R of the up-counter 120, so that the up-counter 120 periodically increases an internal count number (e.g., at each period of the clock signal ClkPkTri), with the internal count number being reset to zero at each occurrence of a pulse in the signal PWM$_{out}$.

As a result of the count of consecutive missing pulses in the signal PWM$_{out}$ reaching a certain value n (e.g., n=6), the output signal ClipDet of the up-counter 120 is asserted (e.g., set to high), thereby indicating saturation of the signal PWM$_{out}$.

In a preferred embodiment, the clock signal ClkPkTri is synchronized with the periodic carrier signal V$_{tri}$.

Additionally, a second up-counter 122 is provided in the clipping detection circuit 12. The second up-counter 122 is configured to:
monitor the signal PWM$_{out}$ and the output signal ClipDet from the timer circuit 120,
determine a number of pulses occurred in the signal PWM$_{out}$ since the last de-assertion of the output signal ClipDet from the timer circuit 120, and
assert a respective output signal ClipOut when the number of pulses in the signal PWM$_{out}$ since the last de-assertion of the output signal ClipDet reaches a certain number m of pulses.

In particular, the second up-counter 122 may be configured to receive the output signal ClipDet from the timer circuit 120 at a respective (asynchronous) reset input, and to receive the signal $PWM_{out}$ as a clock signal.

Therefore, the second up-counter 122 increases (e.g., by one unit) a respective internal count number at each pulse occurring in the signal $PWM_{out}$, with the respective internal count number being (asynchronously) reset to zero at each assertion of the signal ClipDet, i.e., when the signal $PWM_{out}$ is found to enter the clipping region.

The second up-counter 122 therefore counts the number of pulses in the received signal $PWM_{out}$ since the last de-assertion of the signal ClipDet.

As a result of the count of pulses in the received signal $PWM_{out}$ since the last de-assertion of the signal ClipDet reaching a certain value m (e.g., m=3), the output signal ClipOut of the second up-counter 122 is asserted (e.g., set to high).

Additionally, an output signal ClipDet' of the clipping detection circuit 12 may be generated at the output of an OR logic gate 124 which receives the signal ClipDet and a complemented replica of the signal ClipOut, as exemplified in FIG. 4.

In one or more embodiments, a modulation signal $V_{mod}$ may cause the switching PWM modulator circuit 10 to operate in linear region (i.e., with $V_{tri,L} < V_{mod} < V_{tri,H}$), resulting thereby in a pulse of the signal $PWM_{out}$ at each period of a clock signal ClkPkTri synchronized with the periodic carrier signal $V_{tri}$, or in saturation (clipping) region, resulting in a duty-cycle of the signal $PWM_{out}$ close to 0% or 100% and almost no pulses in the signal $PWM_{out}$.

As a result of the switching PWM modulator circuit 10 operating in linear region, the first timer circuit 120 may be reset at each period of the clock signal ClkPkTri, thereby keeping the signal ClipDet de-asserted (i.e., ClipDet=0). Additionally, the second up-counter 122 does not get reset and provides a signal ClipOut asserted (i.e., ClipOut=1). As a result, the output clipping detection signal ClipDet' is de-asserted, i.e., kept at a low logic level indicative of the signal $PWM_{out}$ not being clipped.

As a result of the modulation signal $V_{mod}$ decreasing below $V_{tri,L}$ or increasing above $V_{tri,H}$, thereby causing the switching PWM modulator circuit 10 to start operating in clipping region, no pulses are generated in the signal $PWM_{out}$.

In case no pulses are generated in the signal $PWM_{out}$ for a certain period of time $T_{MAX}$, e.g., for a certain number n of consecutive periods of the clock signal ClkPkTri, the signal ClipDet is commuted to a high logic value, thereby causing also the clipping detection signal ClipDet' to commute to a high logic value and the internal counter of the second up-counter 122 to be reset to zero. The switching PWM modulator circuit 10 is detected as being operating in clipping region.

As long as no pulses are detected in the signal $PWM_{out}$, the state of the clipping detection circuit 12 remains unaltered, with ClipDet=1, ClipOut=0 and ClipDet'=1.

As a result of a pulse being detected in the signal $PWM_{out}$, the counter of the first timer circuit 120 is reset to zero causing the signal ClipDet to commute to low. With ClipDet=0, the counter of the second up-counter 122 does not get reset and starts counting pulses in the signal $PWM_{out}$.

The state of the circuit remains unaltered, with ClipDet=0, ClipOut=0 and ClipDet'=1, until the counter of the second up-counter 122 reaches a certain value m. In such case (and provided that ClipDet stays at a low logic value) the signal ClipOut commutes to a high logic value, resulting in the output clipping detection signal ClipDet' commuting to a low logic value. Thus, the switching PWM modulator circuit 10 is detected as being operating again in linear region.

It will be noted that the signal ClipDet from the first timer circuit 120 being directly coupled to the OR logic gate 124 results in the output clipping detection signal ClipDet' commuting to high in any case as a result of n consecutive missing pulses being detected in the signal $PWM_{out}$, independently from the value of the signal ClipOut.

FIGS. 5 to 8 are exemplary of possible time behavior of signals in one or more embodiments, according to different operating status.

Figure 5:
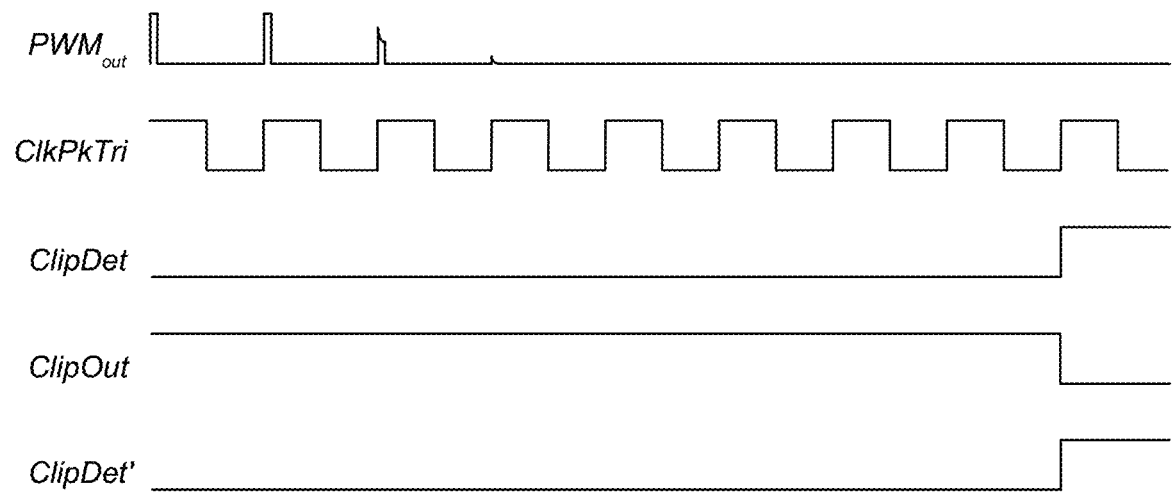
FIGS. 5 to 8 are exemplary of possible time behavior of signals in one or more embodiments.

For instance, FIG. 5 is exemplary of a case wherein n=6 and m=3. The switching PWM modulator circuit 10 initially operates in linear region, with the first timer circuit 120 being reset at each period of the clock signal ClkPkTri and resulting in ClipDet=0. The second up-counter 122 does not get reset and provides ClipOut=1. As a result, ClipDet'=0. As a result of the switching PWM modulator circuit 10 entering the clipping region, no pulses are generated in the signal $PWM_{out}$. After n=6 missing pulses in the signal $PWM_{out}$, the signal ClipDet is commuted to a high logic value, thereby causing also the clipping detection signal ClipDet' to commute to a high logic value and the counter of the second up-counter 122 being reset to zero, resulting in ClipOut=0.

Figure 6:
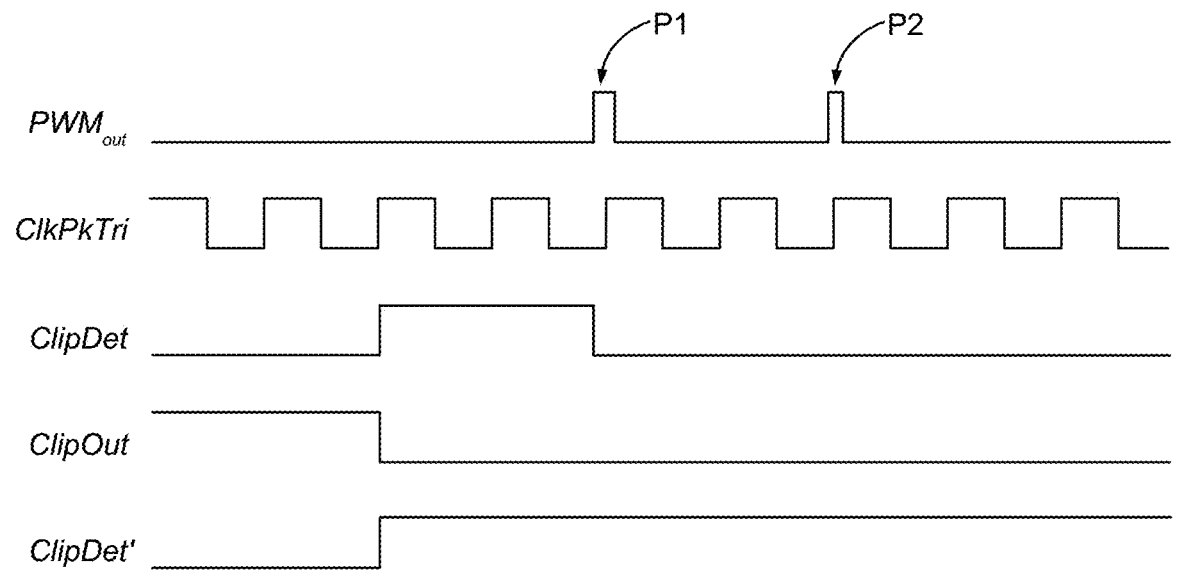

FIG. 6 is exemplary of a case wherein the switching PWM modulator circuit 10 initially operates in linear region with ClipDet=0, ClipOut=1 and ClipDet'=0, then transitions to the clipping region with ClipDet=1, ClipOut=0 and ClipDet'=1 (i.e., the initial portion of the signals exemplified in FIG. 6 may correspond to the final portion of the signals exemplified in FIG. 5).

As a result of a pulse P1 being detected in the signal $PWM_{out}$, the counter of the first timer circuit 120 is reset to zero causing the signal ClipDet to commute to low. With ClipDet=0, the counter of the second up-counter 122 does not get reset and starts counting pulses in the signal $PWM_{out}$, with ClipOut=0. As exemplified in FIG. 6, the signal ClipOut is not commuted to high until the second up-counter 122 reaches the value m (e.g., m=3) (not visible in FIG. 6).

Figure 7:
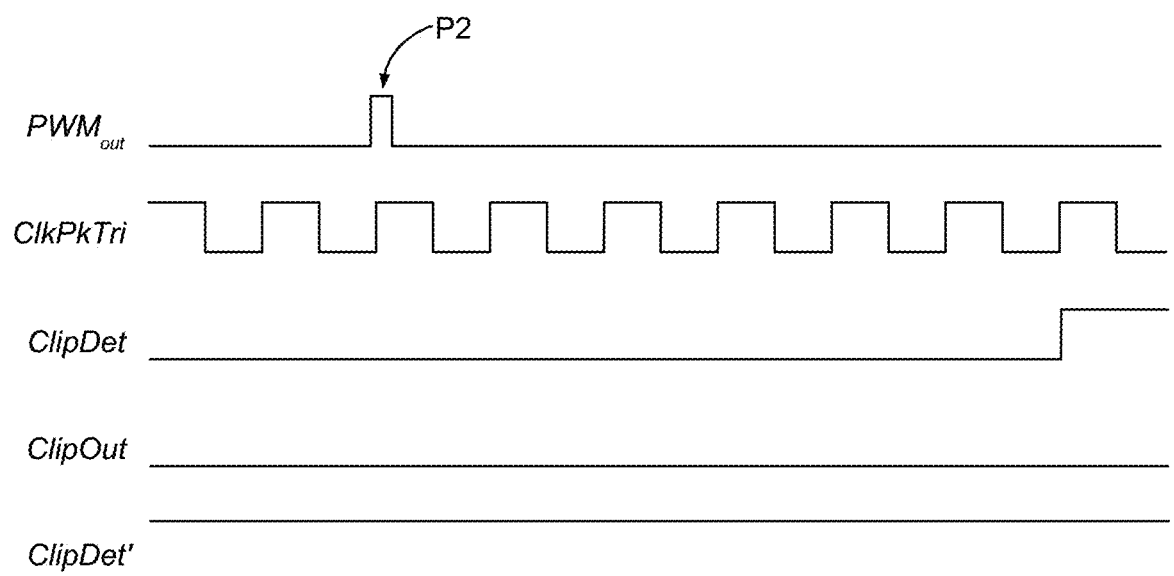

As exemplified in FIG. 7 (again, the initial portion of the signals exemplified in FIG. 7 may correspond to the final portion of the signals exemplified in FIG. 6), after the pair of pulses P1 and P2, the signal $PWM_{out}$ may not comprise other pulses for some time. In such case, if a number n (e.g., n=6) of clock cycles elapse after the pulse P2 without any additional pulse in the signal $PWM_{out}$, the signal ClipDet commutes again to high. The signal ClipOut stays low and the signal ClipDet' stays high, so that pulses P1 and P2 are identified as spurious pulses and do not cause the signal ClipDet' to commute to low.

Figure 8:
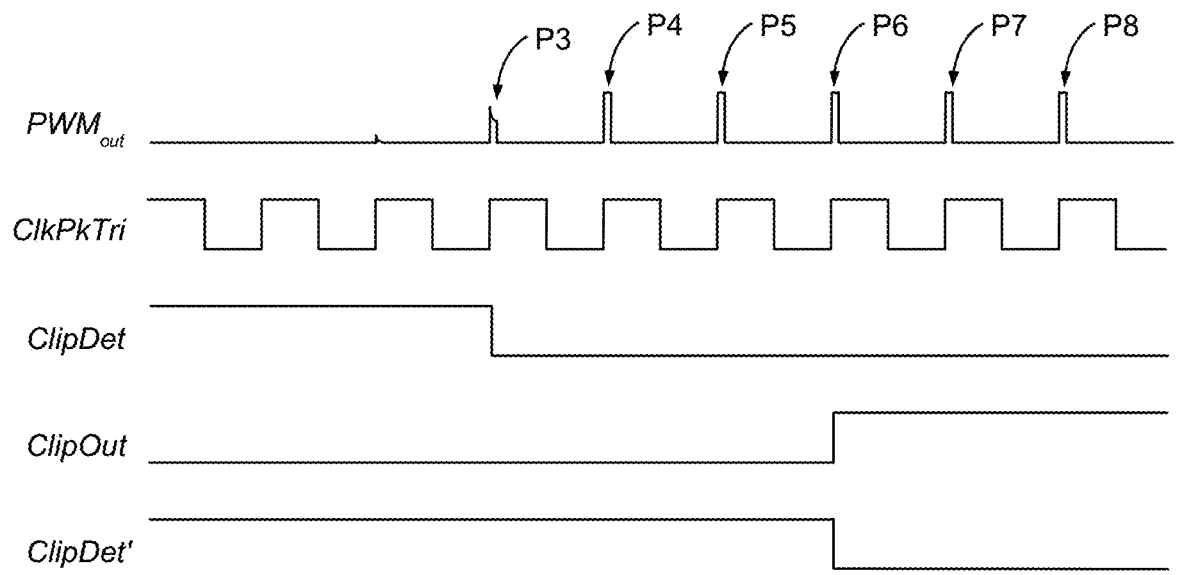

FIG. 8 (again, the initial portion of the signals exemplified in FIG. 8 may correspond to the final portion of the signals exemplified in FIG. 7) is exemplary of a case wherein the switching PWM modulator circuit 10 initially operates in clipping region. As a result of a pulse P3 being detected in the signal $PWM_{out}$, the counter of the timer circuit 120 is reset to zero causing the signal ClipDet to commute to low. With ClipDet=0, the counter of the second up-counter 122 does not get reset and starts counting pulses P3, P4, P5, . . . in the signal $PWM_{out}$, with ClipOut=0. Once the second up-counter 122 reaches the value m (e.g., m=3), the signal ClipOut is commuted to high, determining a commutation to low of the signal ClipDet' which is indicative of the switching PWM modulator circuit 10 having exited from the clipping region.

One or more embodiments may thus be suitable for use in PWM-modulation based system wherein detection of a saturated PWM signal may trigger feedback systems and/or corrective and/or diagnostic circuits. This may be the case, for instance, of audio amplifiers as exemplified in FIG. 9.

Figure 9:
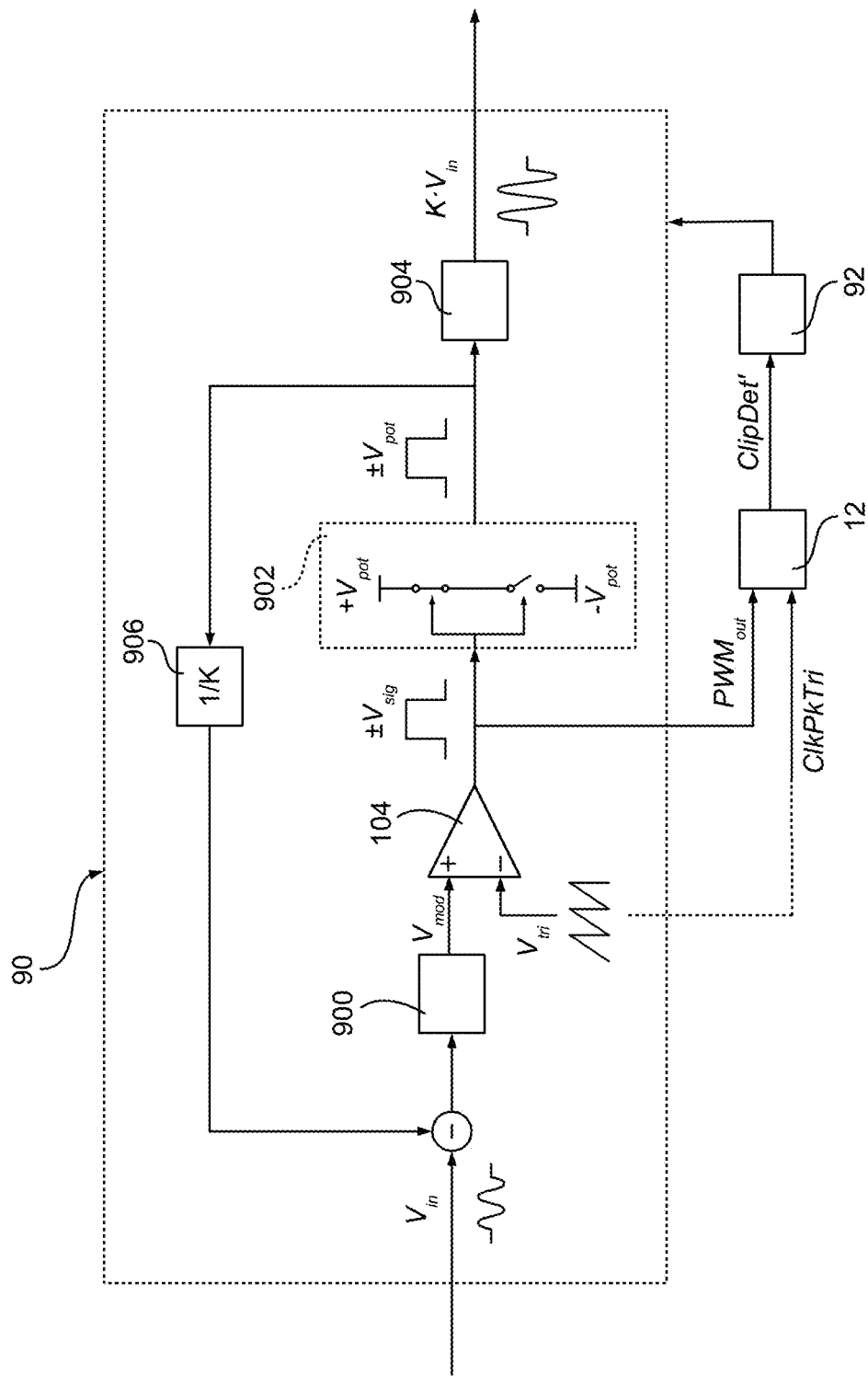
FIG. 9 is exemplary of a possible context of use of one or more embodiments.

FIG. 9 is a circuit diagram of a PWM amplifier 90 exemplary of a possible context of use of a clipping detection circuit 12 according to one or more embodiments.

The PWM amplifier 90o (e.g., a class-D amplifier) is configured to receive an input analog signal $V_{tri}$. The input analog signal $V_{in}$ is propagated to an integrator circuit 900, thereby generating a modulation signal $V_{mod}$. As described in the foregoing, the modulation signal $V_{mod}$ is compared to a triangular or saw-tooth signal $V_{tri}$ in a comparator circuit 104, thereby generating a PWM signal oscillating between values+$V_{sig}$ and –$V_{sig}$. Such PWM signal is used for driving a PWM amplifier stage 902, e.g., a half-bridge arrangement, to generate an output PWM signal oscillating between values+$V_{pot}$ and –$V_{pot}$. The output PWM signal is thus propagated through an LC filter 904, thereby providing an output signal K·$V_{in}$ which is an amplified replica of the input analog signal $V_{in}$. A feedback network 906 with a gain factor 1/K is also provided between the output of the PWM amplifier stage 902 and the input of the integrator circuit 900.

As exemplified in FIG. 9, a clipping detection circuit 12 receives the signal $PWM_{out}$ generated at the output of the comparator circuit 104 and a clock signal ClkPkTri, possibly synchronized with the signal $V_{tri}$, to generate a clipping detection signal ClipDet'. For instance, the clipping detection signal ClipDet' may be received at a processing and/or control unit 92 (e.g., a microprocessor) which may use ClipDet' as a sort of interrupt signal and/or as a control signal for triggering feedback and/or corrective devices for limiting distortion effects on the output signal K·$V_{in}$ of the PWM amplifier 90.

One or more embodiments may advantageously be employed with high frequency (e.g., higher than 1 MHz, such as 2 MHz) switching PWM modulators.

One or more embodiments may facilitate generating an output clipping detection signal ClipDet' which is stable and without spurious commutations or glitches due to the high frequency involved, and which is robust against oscillations and/or noise in the modulation signal $V_{mod}$.

One or more embodiments may facilitate monitoring pulses in the signal $PWM_{out}$ in real time and independently from the clock signal.

One or more embodiments may be tunable and/or adjustable, e.g., by tuning and/or adjusting the threshold values n and m of the first and second up-counters 120, 122, thereby making the behavior of the clipping detection circuit 12 adaptable to different applications and/or requirements.

Without prejudice to the underlying principles, the details and embodiments may vary, even significantly, with respect to what has been described by way of example only, without departing from the extent of protection.

The extent of protection is defined by the annexed claims.

What is claimed is:

1. A clipping detector circuit comprising:
an output terminal;
a timer circuit configured to:
monitor edges of a pulse-width modulated signal,
monitor a time period elapsing since a last occurrence of an edge in the pulse-width modulated signal,
assert a first signal when the time period elapses, and
de-assert the first signal and reset the time period as a result of an edge occurring in the pulse-width modulated signal; and
a counter circuit configured to:
monitor the pulse-width modulated signal and the first signal,
determine a number of pulses in the pulse-width modulated signal since a last de-assertion of the first signal, and
assert a second signal when the number of pulses in the pulse-width modulated signal since the last de-assertion of the first signal reaches m pulses, wherein m is a positive integer greater than 1, wherein the clipping detector circuit is configured to generate at the output terminal a clipping detection signal indicative of whether the pulse-width modulated signal is clipped or not as a function of the first signal and the second signal, wherein the clipping detection signal is a digital signal, and wherein the clipping detector circuit is configured to de-assert the clipping detection signal after m pulses of the pulse-width modulated signal after the first signal is de-asserted.

2. The clipping detector circuit of claim 1, wherein m is less than or equal to 3.

3. The clipping detector circuit of claim 1, wherein the timer circuit comprises a further counter circuit configured to receive a clock signal and to assert the first signal as a result of n periods of the clock signal elapsing since a last occurrence of an edge in the pulse-width modulated signal, wherein n is a positive integer greater than 1.

4. The clipping detector circuit of claim 3, wherein n is less than or equal to 6.

5. The clipping detector circuit of claim 4, wherein m is equal to 3 and n is equal to 6.

6. The clipping detector circuit of claim 3, wherein the clock signal has the same period of the pulse-width modulated signal.

7. The clipping detector circuit of claim 3, wherein the further counter circuit is configured to:
receive the pulse-width modulated signal at a respective reset input and the clock signal at a respective clock input;
increase a respective internal count number at each cycle of the clock signal and reset to zero the respective internal count number at each occurrence of an edge in the pulse-width modulated signal; and
assert the first signal as a result of the respective internal count number reaching a count of n.

8. The clipping detector circuit of claim 1, wherein the counter circuit is configured to:
receive the first signal at a respective reset input and the pulse-width modulated signal at a respective clock input;
increase a respective internal count number at each occurrence of a pulse in the pulse-width modulated signal and reset to zero the respective internal count number at each assertion of the first signal; and
assert the second signal as a result of the respective internal count number reaching a count of m.

9. The clipping detector circuit of claim 1, further comprising an OR logic gate configured to generate the clipping detection signal by performing OR processing of the first signal and a complemented replica of the second signal.

10. The clipping detector circuit of claim 1, wherein the clipping detector circuit is configured to transition the second signal from an asserted state to a de-asserted state when the first signal transitions from a de-asserted state to an asserted state.

11. An electronic system comprising:
a switching pulse-width modulator circuit configured to generate a pulse-width modulated signal by comparing a modulation signal to a periodic carrier signal;
a clipping detector circuit configured to generate a clipping detection signal indicative of whether the pulse-width modulated signal is clipped or not, wherein the clipping detection signal is a digital signal; and
a control unit configured to receive the clipping detection signal from the clipping detector circuit and to act on the switching pulse-width modulator circuit to counter clipping of the pulse-width modulated signal when the clipping detection signal is indicative of the pulse-width modulated signal being clipped, wherein the clipping detector circuit comprises:
a timer circuit configured to:
monitor edges of the pulse-width modulated signal,
monitor a time period elapsing since a last occurrence of an edge in the pulse-width modulated signal,
assert a first signal when the time period elapses, and
de-assert the first signal and reset the time period as a result of an edge occurring in the pulse-width modulated signal, and
a counter circuit configured to:
monitor the pulse-width modulated signal and the first signal,
determine a number of pulses in the pulse-width modulated signal since a last de-assertion of the first signal, and
assert a second signal when the number of pulses in the pulse-width modulated signal since the last de-assertion of the first signal reaches m pulses, wherein m is a positive integer greater than 1, wherein the clipping detector circuit is configured to generate the clipping detection signal as a function of the first signal and the second signal, and wherein the clipping detector circuit is configured to de-assert the clipping detection signal after m pulses of the pulse-width modulated signal after the first signal is de-asserted.

12. The electronic system of claim 11, wherein the electronic system is a class-D amplifier.

13. The electronic system of claim 11, further comprising an integrator circuit having an output configured to generate the modulation signal based on an input signal.

14. The electronic system of claim 13, wherein the input signal is an analog audio signal.

15. The electronic system of claim 13, further comprising:
a pulse-width modulation output stage configured to receive the pulse-width modulated signal;
an LC filter having an input coupled to an output of the pulse-width modulation output stage and configured to generate an amplifier signal based on the input signal; and
a feedback network having an input coupled to the output of the pulse-width modulation output stage and an output coupled to the integrator circuit.

16. The electronic system of claim 11, wherein the timer circuit comprises a further counter circuit configured to:
receive a clock signal that is synchronized with the periodic carrier signal; and
assert the first signal as a result of n periods of the clock signal elapsing since a last occurrence of an edge in the pulse-width modulated signal, wherein n is a positive integer greater than 1.

17. The electronic system of claim 16, wherein the further counter circuit comprises an output terminal coupled to a reset terminal of the timer circuit.

18. A method comprising:
monitoring edges of a pulse-width modulated signal;
monitoring a time period elapsing since a last occurrence of an edge in the pulse-width modulated signal;
asserting a first signal when the time period elapses;
de-asserting the first signal and resetting the time period as a result of an edge occurring in the pulse-width modulated signal;
determining a number of pulses in the pulse-width modulated signal since a last de-assertion of the first signal;
asserting a second signal when the number of pulses in the pulse-width modulated signal since the last de-assertion of the first signal reaches a m pulses, wherein m is a positive integer greater than 1; and
generating a clipping detection signal indicative of whether the pulse-width modulated signal is clipped or not as a function of the first signal and the second signal, wherein the clipping detection signal is a digital signal, and wherein the clipping detection signal is deasserted after m pulses of the pulse-width modulated signal after the first signal is de-asserted.

19. The method of claim 18, wherein the pulse-width modulated signal has a frequency higher than 1 MHz.

20. The method of claim 18, further comprising:
receiving a clock signal; and
asserting the first signal as a result of n periods of the clock signal elapsing since a last occurrence of an edge in the pulse-width modulated signal, wherein n is a positive integer greater than 1.

21. The method of claim 20, wherein m is equal to 3 and n is equal to 6.

* * * * *